United States Patent
Roh et al.

[11] Patent Number: 5,907,159
[45] Date of Patent: May 25, 1999

[54] HOT ELECTRON DEVICE AND A RESONANT TUNNELING HOT ELECTRON DEVICE

[75] Inventors: Dong Wan Roh; Gyung Ock Kim, both of Daejon-Shi, Rep. of Korea

[73] Assignee: Electronics And Telecommunications Research Institute, Daejon-Shi, Rep. of Korea

[21] Appl. No.: 08/963,393

[22] Filed: Nov. 3, 1997

[30] Foreign Application Priority Data

Nov. 5, 1996 [KR] Rep. of Korea ...................... 96-52022

[51] Int. Cl.⁶ ............................. H01L 29/06; H01L 29/76
[52] U.S. Cl. ................................ 257/26; 257/29; 257/25; 257/191
[58] Field of Search ................................. 257/26, 25, 29, 257/191, 197

[56] References Cited

U.S. PATENT DOCUMENTS

| | | | |
|---|---|---|---|
| 5,182,233 | 1/1993 | Inoue | 257/627 X |
| 5,773,842 | 6/1998 | Kim et al. | 257/25 |

FOREIGN PATENT DOCUMENTS

| | | | |
|---|---|---|---|
| 0440139A1 | 8/1991 | European Pat. Off. | H01L 29/76 |
| 1-214164 | 8/1989 | Japan | 257/26 |
| 2-148867 | 6/1990 | Japan | 257/25 |

OTHER PUBLICATIONS

W. L. Chen, et al., "InGaAs/AlAs/InGaAsP Resonant Tunneling Hot Electron Transistors Grown by Chemical Beam Epitaxy," IEEE Trans. Electron Devices, vol. 41, No. 2, Feb. 1994, pp. 155–161.

*Primary Examiner*—John Guay
*Attorney, Agent, or Firm*—Cohen, Pontani, Lieberman & Pavane

[57] ABSTRACT

The present invention is to solve the problems caused in various methods used to improve the performance of the device by improvement of conventional base layer. The present invention discloses a hot electron device which can improve the performance of the device such as the improvement in the current density and decrease in transition time by reducing the dispersion phenomenon by introducing indium arsenide layer having v-shape conduction band due to the graded composition as the base layer of hetero structure hot electron device (HET).

In addition, the present invention discloses a resonant tunneling hot electron device which is constructed by adding an emitter electron projection layer to the hot electron device of the present invention so that the Fermi energy and alignment can occur due to the stark shift and the projection of hot electron to the base region can occur through the Fermi energy and alignment.

2 Claims, 3 Drawing Sheets

HOT ELECTRON DEVICE AND A RESONANT TUNNELING HOT ELECTRON DEVICE

BACKGROUND OF INVENTION

1. Field of the Invention

The present invention relates to a hot electron device (HET), and particularly to a hot electron device in which an indium arsenide (InAs) epitaxlal layer which has high electron mobility due to small effective electron mass is specially formed as a base layer material in a hetero structure hot electron device.

The present invention also relates to a resonant tunneling hot electron device which induces a resonant tunneling by adding an emitter electron projection layer to the hot electron device.

For several years, developments of semiconductor devices using the heterostructure have been vigorous' as the semiconductor growth technology such as the molecular beam epitaxy (MBE) and metal organic chemical vapor deposition (MOCVD) has been developed. Among the devices, the hot electron device using very short and quick transition time of hot electron in the base region has been given a great interest and the research thereof have been under progress. In case of using an indium arsenide having high electron mobility as the base material, the electron transition time is further improved so that the performance of the device is improved.

The conventional techniques that improve the electrical characteristics of the base layer are as follows:

1) n-GaAs (emitter) /i-AlGaAs (emitter barrier layer) /n-GaAs (base) /i-AlGaAs (collector barrier layer) /n-GaAs (collector) /GaAs (substrate);

2) n-GaAs (emitter) /i-AlGaAs (emitter barrier layer) /n-InGaAs (base) /i-AlGaAs(collector barrier layer) /n-GaAs (collector) /GaAs (substrate);

3) n-InGaAs (emitter) /i-InAlAs (emitter barrier layer) /n-InGaAs (base) i-InAlAs (collector barrier layer) /n-InGaAs (collector) /InP (substrate);

4) n-AlSbAs (emitter) /n-InAs (base) /i-GaSb (collector barrier layer) /n-GaSb (collector) /GaSb (substrate).

Classifying the hot electron device according to the technique which can improve the performance of the device due to the improvement of the base layer, the device can be classified into a gallium arsenide based (GaAs-based) ,indium phosphide based (InP-based) and gallium antimonide based (GaSb) series. In case of GaAs-based series hot electron device, a doped gallium arsenide layer is used as an emitter, base and collector layers. An aluminum gallium arsenide ($Al_xGa_{1-x}As$), x=0.3–1.0, is used as an emitter barrier layer between the emitter layer and base layer and as a collector barrier layer between the base layer and collector layer. In case of using a doped gallium arsenide layer as the base layer, the ratio of current that can move from the emitter to collector is small so as to lower the height of the collector barrier layer so that the collector current gain is raised. However, as the height of the collector barrier layer is lowered, the collector-base voltage $V_{CB}$ with which the operation of device is possible without leak current of collector layer is lowered. Therefore, high electron mobility indium gallium arsenide ($In_xGa_{1-x}As$), x=0.53–0.8, is introduced as the base layer to improve the electrical characteristics. In this case, Γ-L separation is large so that dispersion of electrons due to L valley is reduced and the conduction band discontinuity with collector barrier layer is increased thereby reducing the content of aluminum arsenide AlAs of collector barrier layer and raising the collector-base voltage $V_{CB}$. An indium gallium arsenide ($In_xGa_{1-x}As$) base layer of indium composition of 0.53 to 0.8 is lattice mismatched with gallium arsenide layer. The lattice mismatch causes strain and crystal defects in the lattice thereby raising device operation voltage. To solve this problem, it is necessary to reduce the thickness and doping concentration of base layer, or to lower the height of collector barrier layer. However, as the doping concentration of base is reduced, scattering within the base layer reduces and current gain increases, resulting in increase in device ohmic resistance. It is known that, in general, an indium arsenide layer can lower base resistance and raise current gain at the same doping concentration compared with indium gallium arsenide ($In_xGa_{1-x}As$), x=0.53–0.8. For example, ohmic resistance can be improved by lowering the height of Schottky barrier layer by introducing an indium arsenide layer at the surface. However, about 7% lattice mismatch exists between a gallium arsenide layer with a 5.6532 Å lattice constant and an indium arsenide layer with a 6.0583 Å lattice constant. The critical thickness which can grow due to the lattice mismatch exists, and the degradation of electrical characteristics occurs became of misfit dislocations, stacking faults, etc., at the grown epitaxial layer. Because of such problems, the indium phosphide material family is used wherein an InP substrates can accomplish lattice match.

In case of indium phosphide series hot electron device, doped indium gallium arsenide (InGaAs) is used as emitter, base and collector layers. An indium alluminium gallium arsenide (InAlGaAs) layer of a variety of aluminum composition is used as the emitter barrier layer between the emitter layer and base layer and as the collector barrier layer between the base layer and collector layer. Also in this case, since indium arsenide material having high electron mobility is applied, about 4% lattice mismatch exists between the indium phosphide layer with 5.8687 Å lattice constant and indium arsenide layer with 6.0583 Å lattice constant. There are various problems regarding critical thickness which can grow without crystal defects from lattice mismatch and the strain in an epitaxial layer. When growing the epitaxial layer, there is no problem if the layer is grown within its critical thickness, and electron transition time can be improved by reducing base layer resistance. This is accomplished base layer by reducing thickness, however, a significant problem arises since the device may be destroyed by metal diffusion at the time of forming ohmic contact to the base layer after growth of the epitaxial layer. Therefore, the base layer of thickness of about 300 Å is necessary.

In case of gallium antimonide series, when an indium arsenide layer is applide, there is no substantial lattice mismatch between the gallium antimonide layer of unit length of crystal structure of 5.8687 Å and indium arsenide layer of that of 6.0583 Å, therefore theoretically the lattice match is obtained and the epitaxial growth is possible. However, there were various problems in the manufacture of actual device due to difficulty in manufacture of high cost gallium antimonide substrate, unestablishment of thin film growth technology, and instability of device manufacturing process and soon.

SUMMARY OF THE INVENTION

Therefore, an object of the present invention is to provide a hot electron device which can improve the performance of the device such as improvement of current density and the reduction in transition time by reducing the phenomenon of electrons scattering by introducing an indium arsenide layer having V-shape conduction band of the graded composition as the base layer of hetero structure hot electron device.

Another object of the present invention is to easily manufacture the hot electron device by introducing the epitaxial layer having lattice composition so as to solve the problem of lattice mismatch at the time of growth of indium arsenide layer.

A hot electron device according to the first embodiment of the present invention to achieve the above described object is characterized in that it comprises a substrate having a direction [100]; a collector layer formed at a selected area of top of said substrate; a collector barrier layer formed at a selected area of top of said collector layer; a base layer formed at the top of said collector barrier layer; a buffer layer formed at a selected area of top of said base layer; an emitter barrier layer formed at the top of said buffer layer; and an emitter layer formed at the top of said emitter barrier layer.

Here, the base layer is characterized in that it has a V-shape conduction band which gradually changes the composition starting from the composition accomplishing the lattice match with collector barrier layer, gradually changing the composition upto the middle of base layer so that the conduction band of base layer reaches a minimum value, and gradually changing again the composition upto the emitter barrier layer so that its composition changes to the lattice match composition.

In addition, the resonant tunneling hot electron device according to the second embodiment of the present invention is characterized in that a quantum well layer is combined between an emitter barrier layer and a barrier layer as an emitter electron projection layer instead of the emitter barrier layer in the first embodiment of the present invention. At this time, quantum-well confined state are formed in quantum well layer. That is, the device constructed in such a way that the Fermi energy and alignment occur due to stark shift and the projection of hot electron to the base region there through occurs.

BRIEF DESCRIPTION OF THE DRAWINGS

For fuller understanding of the nature and object of the invention, reference should be had to the following detailed description taken in conjunction with the accompanying drawings in which.

Similar reference characters refer to similar parts in the several views of the drawings.

DETAILED DESCRIPTION OF THE INVENTION

The present invention will be described in detail with reference to the accompanying drawings.

Figure 1:
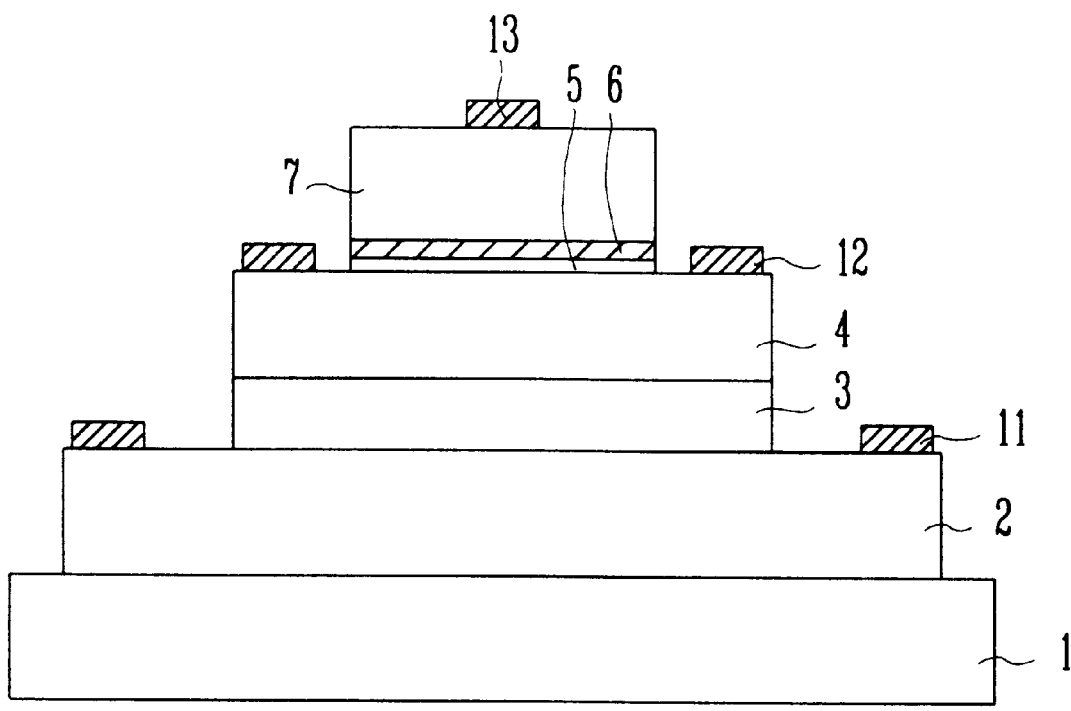
FIG. 1 is a sectional view of a hot electron device according to the first embodiment of the present invention.

FIG. 1 is a sectional view of a hot electron device according to the first embodiment of the present invention. Here, the base layer has a conduction band of V-shape which gradually changes the composition starting from the composition that accomplishes the lattice match with the collector barrier layer, gradually changing the composition upto the middle of the base layer so that the conduction band of the base layer reach a minimum value, and again changing the composition to the lattice match composition upto the emitter barrier layer. The growth of compound semiconductor of hetero structure is accomplished by the following method. A collector layer 2 which consists of a doped indium gallium arsenide (InGaAs) compound semiconductor is formed on a selected area of top of semi-insulation indium phosphide (InP) substrate 1 having a direction [100]. A collector barrier layer 3 which consists of an undoped indium gallium aluminum arsenide (InGa$_x$Al$_y$As) compound semiconductor is formed on a selected area of top of the collector layer 2, and a collector electrode 11 is formed. A base layer 4 which consists of a doped indium gallium arsenide (In$_x$Ga$_{1-x}$As) is formed on top of the collector barrier layer 3.

A buffer layer 5 which consists of an undoped indium gallium arsenide (InGaAs) or indium alluminium arsenide (InAlAs) compound semiconductor is formed at a selected area of top of the base layer 4, and a base electrode 12 is formed. An emitter barrier layer 6 which consists of an undoped indium alluminium arsenide (InAlAs) compound semiconductor is formed on top of the buffer layer 5. An emitter layer 7 which consists of a doped indium gallium arsenide (InGaAs) is formed on top of the emitter barrier layer 6. An emitter electrode 13 is formed on a selected area of top of the emitter layer 7. Here, the composition of each epitaxial layer is as follows. The base layer 4 starts with an indium gallium arsenide (InGaAs) compound semiconductor having the composition of doped 53% indium (In), is grown to be an indium arsenide (InAs) compound semiconductor having the composition of 100% indium (In) component to have a graded composition, and thereafter is again made to be an indium gallium arsenide (InGaAs) compound semiconductor having the composition of 53% indium (In). In this way, the base layer 4 has a conduction band of V shape. Excluding the collector barrier layer 3 which consists of undoped indium gallium aluminum arsenide (InGa$_x$Al$_y$As) compound semiconductor, in the buffer layer 5 and emitter barrier layer 6 which consist of indium aluminum arsenide (InAlAs) compound semiconductor, the III family element consisting of 52% indium (In) and 48% aluminum (Al) and the V family element of arsenide (As) make 1:1 composition. In the collector layer 2, base layer 4, buffer layer 5 and emitter layer 7, the 3 family element consisting of 53% indium (In) and 47% gallium (Ga) and the V family element of arsenide (As) make 1:1 composition.

Figure 2:
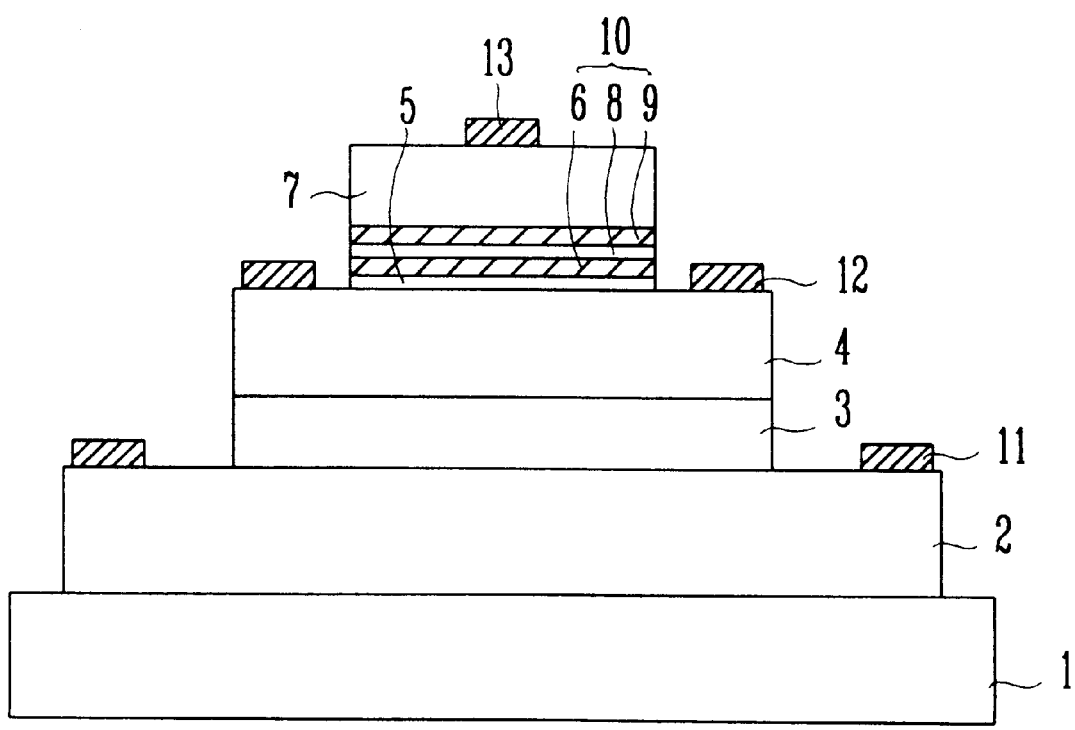
FIG. 2 is a sectional view of a resonant tunneling hot electron device according to the second embodiment of the present invention.

FIG. 2 is a sectional view of a resonant tunneling hot electron device according to the second embodiment of the present invention. A collector layer 2 which consists of a doped indium gallium arsenide (InGaAs) compound semiconductor is formed on a selected area of top of semi-insulation indium phosphide (InP) substrate 1 having a direction [100]. A collector barrier layer 3 which consists of an undoped indium gallium aluminum arsenide (InGa$_x$Al$_y$As) compound semiconductor is formed oin a selected area of top of the collector layer 2, and a collector electrode 11 is formed. A base layer 4 which consists of a doped indium gallium arsenide (In$_x$Ga$_{1-x}$As) is formed on top of the collector barrier layer 3. A buffer layer 5 which consists of an undoped indium gallium arsenide (InGaAs) or indium aluminum arsenide (InAlAs) compound semiconductor is formed on a selected area of top of the base layer 4, and a base electrode 12 is formed. An emitter barrier layer 6 which consists of an undoped indium aluminum arsenide (InAlAs) compound semiconductor is formed on top of the buffer layer 5.

A quantum well layer 8 which consists an indium gallium arsenide (InGaAs) compound semiconductor is formed on top of the emitter barrier layer 6. A barrier layer 9 which consists of an undoped indium aluminum arsenide (InAlAs) compound semiconductor is formed on top of the quantum well layer 8. An emitter electron projection layer 10 consists of the emitter barrier layer 6, quantum well layer 8 and barrier layer 9. An emitter layer 7 which consists of a doped indium gallium arsenide (InGaAs) is formed on top of the barrier layer 9. An emitter electrode 13 is formed on a selected area of top of the emitter layer 7. Here, the structure of each epitaxial layer is same as that of FIG. 1. The quantum well confined state of the emitter electron projection layer 10 can be controlled by the area of each layer.

The emitter barrier layer 3 and the buffer layer 5 between barrier layer 9 and conduction base can be introduced with a degree of freedom of adjusting the area so that the resonant tunneling can occur through fermi energy and aligned quantum well confined state. The positions of these layers can be placed in front of and behind the structure of emitter electron projection layer 10. The alignment of the quantum well confined state of electron according to the stark shift is determined by the combination of the area of the quantum well layer 8 of emitter electron projection layer 10 and the area of the buffer layer 5.

FIG. 3A through FIG. 3D are schematic energy diagrams showing the lowest state of conduction band in each layer of each voltage according to the present invention.

Figure 3A:
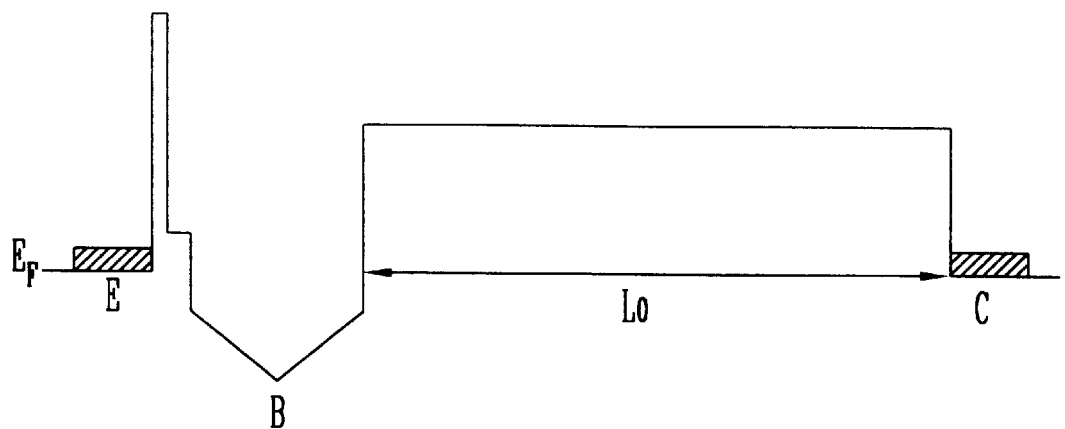
FIGS. 3A to 3D are energy band diagrams showing the lowest state of conduction band in each layer under each voltage according to the present invention.

FIG. 3A is schematic energy diagram of structural layers of the hot electron device (HET) in thermal equilibrium condition according to the present invention. A thin and high emitter barrier layer is formed between the emitter E and base B, and the base B has a conduction band of V-shape. A collector barrier layer which is relatively lower and wider than the emitter barrier layer is formed between the base B and collector C.

Figure 3B:
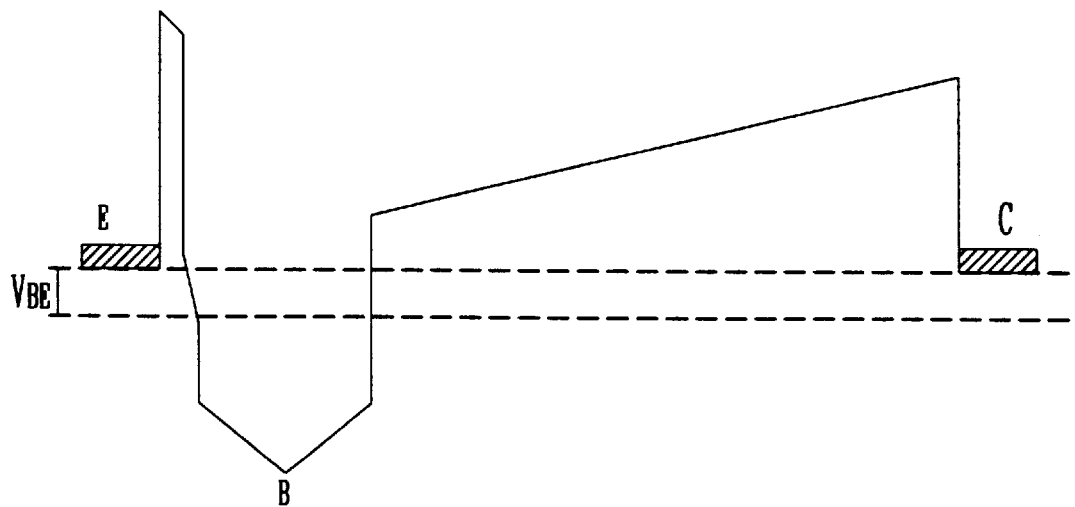

FIG. 3B is schematic energy diagram of structural layers of hot electron device at the time of applying a voltage $V_{BE}$ between emitter and base according to the present invention. The emitter barrier layer becomes relatively thicker than equilibrium condition by applying the emitter-base voltage $V_{EB}$ to the energy band in equilibrium condition. The energy band of the base B is formed in V-shape as deep as the emitter-base voltage $V_{EB}$. The collector barrier layer between the base B and collector C starts with lower position than equilibrium condition, is formed as being increased as much as the height of emitter barrier layer, and is formed to be equal to thickness in equilibrium condition.

Figure 3C:
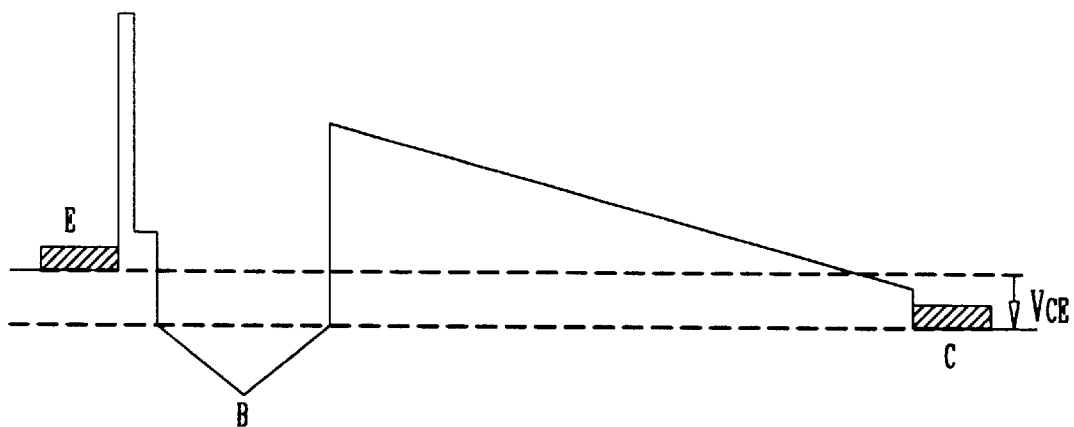

FIG. 3C is schematic energy diagram of structural layers of hot electron device at the time of applying a collector-emitter voltage $V_{CE}$ according to the present invention. The emitter barrier layer becomes relatively thicker than equilibrium condition by applying the collector-emitter voltage $V_{CE}$, and the base B having energy band of V-shape is formed in the same condition as equilibrium condition. The collector barrier layer starts with the same condition as equilibrium condition and is formed at a position lowered as much as the height applying collector-emitter voltage $V_{CE}$ from emitter voltage of equilibrium condition, that is, to the top of energy band of base of v-shape. The thickness of collector barrier layer is same as equilibrium.

Figure 3D:
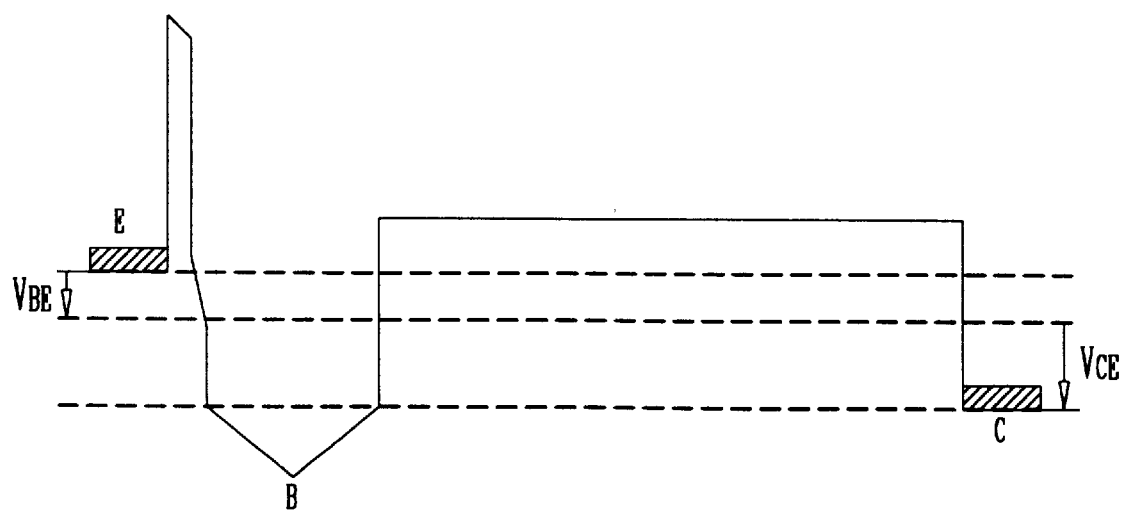

FIG. 3D is schematic energy diagram of structural layers of hot electron device at the time of applying the base-emitter voltage $V_{BE}$ and collector-emitter voltage $V_{CE}$ according to the present invention. FIG. 3D has the shape in which FIG. 3B and FIG. 3C are combined. That is, the emitter barrier layer is increased as much as the emitter-base voltage $V_{EB}$, and the collector barrier layer is formed to the height of equilibrium condition, however, the collector is formed at a position lowered as much as collector-emitter voltage $V_{CE}$. As can be seen from energy band diagram, the transition time of electrons can be reduced by the base layer with conduction band. In case of using multiple barrier resonant tunneling structure having more than three barriers structure instead of double barrier resonant tunneling structure, further increased variety is provided since a multi-current peak is possible by the resonant tunneling through more than two aligned quantum well confined state.

As described above, according to the present invention, the effective electron mass is made small and the electron mobility is increased by graded composing the indium arsenide (InAs) as the base layer of hot electron device according to the present invention, and the scattering of electron due to L valley is decreased by making Γ-L separation large. In addition, the content of aluminum arsenide (AlAs) of the collector barrier layer can be reduced and the collector-base voltage $V_{CB}$ can be increased by increasing conduction-band discontinuity with the collector barrier layer. In addition, the time of transition of electron can be reduced by raising collector-base voltage $V_{CB}$, and the collector gain can be increased by reducing the base resistance at the high doping concentration for metallization for ohmic contact, so that there is an excellent effect that it can be used as an improved super-high-speed device, high frequency oscillator and a high speed logic device of novel function.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A hot electron device comprising:
    a substrate having a direction [100];
    a collector layer having a lattice structure formed at a selected area on top of said substrate;
    a collector barrier layer formed at a selected area on top of said collector layer;
    a base layer having a lattice structure formed on top of said collector barrier layer;
    a buffer layer formed at a selected area on top of said base layer;
    an emitter barrier layer having a lattice structure formed on top of said buffer layer and forming an interface with the base layer; and
    an emitter layer formed at the top of said emitter barrier layer, wherein the lattice structure of the base layer is matched to the lattice structure of said collector barrier layer where the base layer is formed at the top of said collector barrier layer, and where the base layer's conduction changes gradually by changing the base layer's composition so that the base layer's conduction band reaches a minimum value at about a middle portion of the base layer, and the base layer's lattice structure matches the lattice structure of the said emitter barrier layer at the base layer and emitter barrier interface.

2. A resonant tunneling hot electron device comprising:

a substrate having a direction [100];

a collector layer having a lattice structure formed at a selected area on top of said substrate;

a collector barrier layer formed at a selected area on top of said collector layer;

a base layer having a lattice structure formed on top of said collector barrier layer;

a buffer layer formed at a selected area on top of said base layer;

an emitter barrier layer having a lattice structure formed on top of said buffer layer and forming an interface with the base layer;

a quantum well layer formed on top of said emitter barrier layer;

a barrier layer formed on top of said quantum well layer; and an emitter layer formed on top of said barrier layer, wherein the lattice structure of the base layer is matched to the lattice structure of said collector barrier layer where the base layer is formed at the top of said collector barrier layer, and where the base layer's conduction changes gradually by changing the base layer's composition so that the base layer's conduction band reaches a minimum value at about a middle portion of the base layer, and the base layer's lattice structure matches the lattice structure of the said emitter barrier layer at the base layer and emitter barrier interface .

* * * * *